United States Patent
Oh et al.

(10) Patent No.: US 9,437,441 B2
(45) Date of Patent: Sep. 6, 2016

(54) METHODS FOR ETCHING SUBSTRATE AND SEMICONDUCTOR DEVICES

(71) Applicant: Industry-Academic Cooperation Foundation, Yonsei University, Seoul (KR)

(72) Inventors: Jungwoo Oh, Incheon (KR); Yunwon Song, Incheon (KR); Bugeun Ki, Incheon (KR); Keorock Choi, Incheon (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 14/835,513

(22) Filed: Aug. 25, 2015

(65) Prior Publication Data

US 2016/0133478 A1 May 12, 2016

(30) Foreign Application Priority Data

Nov. 11, 2014 (KR) .................. 10-2014-0155921

(51) Int. Cl.
*H01L 21/311* (2006.01)
*H01L 21/461* (2006.01)
*H01L 29/06* (2006.01)
*H01L 21/306* (2006.01)

(52) U.S. Cl.
CPC .................. *H01L 21/30617* (2013.01)

(58) Field of Classification Search
CPC ....... B82Y 40/00; B82Y 10/00; B82Y 30/00; Y10T 428/24917; H01L 29/0665; H01L 21/30604; H01L 21/30608; H01L 21/3081; H05K 3/381; H05K 2201/096; C23C 18/31; B41J 2/1629

USPC .................. 438/694, 700, 745, 752, 753
See application file for complete search history.

(56) References Cited

U.S. PATENT DOCUMENTS

| 2010/0248449 | A1* | 9/2010 | Hildreth | B81C 1/00071 |
| | | | | 438/460 |
| 2012/0168713 | A1* | 7/2012 | Lee | B82Y 30/00 |
| | | | | 257/9 |

(Continued)

FOREIGN PATENT DOCUMENTS

| KR | 10-2001-0039636 | 5/2001 |
| KR | 10-2010-0019722 | 2/2010 |

(Continued)

OTHER PUBLICATIONS

Dejarld, M., et al., Formation of High Aspect Ratio GaAs Nanostructures with Metal-Assisted Chemical Etching, Nano Lett, 2011, 11(12), pp. 5259-5263 (5 pgs).

(Continued)

*Primary Examiner* — Hsien Ming Lee
(74) *Attorney, Agent, or Firm* — Procopio, Cory, Hargreaves & Savitch LLP

(57) ABSTRACT

A method of etching a substrate using a metal-assisted chemical etching process is provided. The method may include forming a metal catalytic layer to a predetermined thickness on a substrate and reacting the metal catalytic layer with the etching solution to form a porous surface in the metal catalytic layer and etch the substrate. When the metal catalytic layer is reacted with an etching solution, a porous surface may be formed on the metal catalytic layer.

9 Claims, 15 Drawing Sheets

(56) References Cited

U.S. PATENT DOCUMENTS

2014/0335411 A1* 11/2014 Liu .................... C23C 18/1601
429/218.1
2015/0050556 A1* 2/2015 Liu ........................ C09K 13/08
429/218.1

FOREIGN PATENT DOCUMENTS

| KR | 10-2010-0095680 A | 9/2010 |
|----|-------------------|--------|
| KR | 10-2011-0024892   | 3/2011 |
| KR | 10-1027493        | 4/2011 |
| KR | 10-2012-0015512 A | 2/2012 |
| KR | 10-2012-0023436 A | 3/2012 |

OTHER PUBLICATIONS

Geyer, N., et al., Model for the Mass Transport During Metal-Assisted Chemical Etching With Contiguous Metal Films as Catalysts, J. Phys. Chem. C, 2012, 116(24), pp. 13446-13451 (6 pgs).

Song, Y., In-Plane and Out-of-Plane Mass Transport During Metal-Assisted Chemical Etching of GaAs, J. Mater. Chem. A, 2014, 2, (5 pgs).

* cited by examiner

METHODS FOR ETCHING SUBSTRATE AND SEMICONDUCTOR DEVICES

CROSS-REFERENCE TO RELATED APPLICATIONS

This U.S. non-provisional patent application claims priority under 35 U.S.C. §119 to Korean Patent Application No. 10-2014-0155921, filed on Nov. 11, 2014, in the Korean Intellectual Property Office, the entire contents of which are hereby incorporated by reference.

STATEMENT REGARDING PRIOR DISCLOSURES BY THE INVENTORS

The inventors of the present application authored and disclosed the subject matter of the present application on May 12, 2014 (published online), Jul. 1, 2014 (published online) and Aug. 7, 2014 (published in journal). These prior disclosures have been submitted in an Information Disclosure Statement in the present application as "SONG, Y., In-Plane and Out-of-Plane Mass Transport During Metal-Assisted Chemical Etching of GaAs, J. Mater. Chem. A, 2014, 2, (5 pgs)."

BACKGROUND OF THE INVENTION

This disclosure relates to a method of etching a substrate and a semiconductor device fabricated thereby, and in particular, to a method of etching a substrate using a metal-assisted chemical etching process and a semiconductor device fabricated thereby.

In general, a semiconductor fabrication includes a process of etching a substrate. For example, a metal-assisted chemical etching method may be used to etch a substrate. In the metal-assisted chemical etching method, a metal catalyst is used to etch a substrate. For example, a metal catalyst pattern is deposited to a thickness of several tens nanometers or higher on a to-be-etched substrate, and the substrate with the metal catalyst pattern is dipped into an etching solution to etch the substrate using an oxidation-reduction reaction. In other words, if a metal catalyst layer is formed on a to-be-etched region of a substrate and the resulting structure is dipped into an etching solution, an oxidation-reduction reaction at an interface between the metal catalyst layer and the substrate results in infiltration of the metal catalyst into the substrate, and as a result, the substrate is etched.

The use of the metal-assisted chemical etching method may make it possible to realize a one-dimensional etching anisotropy and to reduce crystal damage and plasma damage on a surface of a semiconductor substrate. Accordingly, it is possible to reduce surface defects of a semiconductor substrate, which may occur in other etching methods. As a result, by using the metal-assisted chemical etching method, it is possible to overcome the surface defects, which may be caused by high-energy ions in a conventional dry-etching process, and to avoid an isotropic etching property, which may occur in a wet etching process.

Although a silicon-based semiconductor industry has been remarkably advanced during the last decades, it suffers from a difficulty in increasing an integration density of a semiconductor device. Alternatively, there is an increasing interest in the use of a compound semiconductor material, whose electron mobility and optical property are superior to silicon, and the compound semiconductor material (e.g., III-V semiconductor material) is being developed in the industries of a light-emitting diode (LED) and a power device. However, due to a difference in chemical and physical properties between the compound semiconductor material and the silicon, if a conventional metal-assisted chemical etching method for a silicon substrate were used, there may be a difficulty in obtaining a desired etching property to a compound semiconductor substrate.

SUMMARY

Example embodiments of the inventive concept provide a method capable of etching a substrate with an increased etch rate and a semiconductor device fabricated using the method.

Other example embodiments of the inventive concept provide a method capable of etching a compound semiconductor substrate (e.g., made of GaAs) with improved etching characteristics.

Still other example embodiments of the inventive concept provide a substrate-etching method using a metal-assisted chemical etching process and a semiconductor device fabricated by the method. In the substrate-etching method, a metal catalytic layer is formed to have a porous surface provided with pin holes of a desired density, and this makes it possible to uniformly etch a large-area substrate and to fabricate a three-dimensional semiconductor structure with a high aspect ratio.

According to example embodiments of the inventive concept, a method of etching a substrate using a metal-assisted chemical etching process. The method may include forming a metal catalytic layer to a predetermined thickness on a to-be-etched substrate and reacting the metal catalytic layer with the etching solution to form a porous surface in the metal catalytic layer and etch the substrate. Here, when the metal catalytic layer may be reacted with an etching solution, a porous surface may be formed on the metal catalytic layer.

In example embodiments, a plurality of pin holes of the porous surface are formed in the metal catalytic layer and are used to etch the substrate.

In example embodiments, the metal catalytic layer may include at least one of metal catalytic materials including gold (Au), silver (Ag), platinum (Pt), and palladium (Pd).

In example embodiments, the metal catalytic layer on the substrate may be formed to have a thickness greater than 3 nm and less than 10 nm.

In example embodiments, the metal catalytic layer on the substrate may be formed to have a thickness ranging from 4 nm to 6 nm.

In example embodiments, the pin holes may be formed in the metal catalytic layer to have a density of 1-300 ea/$\mu m^2$.

In example embodiments, the etching solution may contain at least one of $H_2SO_4$ and HF and at least one of $KMnO_4$ and $H_2O_2$.

In example embodiments, the etching solution may contain $H_2SO_4$ and $KMnO_4$, and a molar concentration ratio of $H_2SO_4$ to $KMnO_4$ may range from 200:1 to 1000:1.

In example embodiments, a temperature of the etching solution may range from 40° C. to 60° C.

According to other example embodiments of the inventive concept, a semiconductor device may include a substrate and a metal catalytic layer on the substrate. The metal catalytic layer may be provided to have a thickness ranging from 3 nm to 10 nm and have a porous surface.

In example embodiments, the metal catalytic layer may be provided to have a plurality of pin holes formed in the porous surface.

According to still other example embodiments of the inventive concept, a semiconductor device may include a substrate and a metal catalytic layer on the substrate. The metal catalytic layer may have a porous surface provided with a plurality of pin holes, and the pin holes may be formed to have a density of 1-300 ea/$\mu m^2$ on the porous surface of the metal catalytic layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
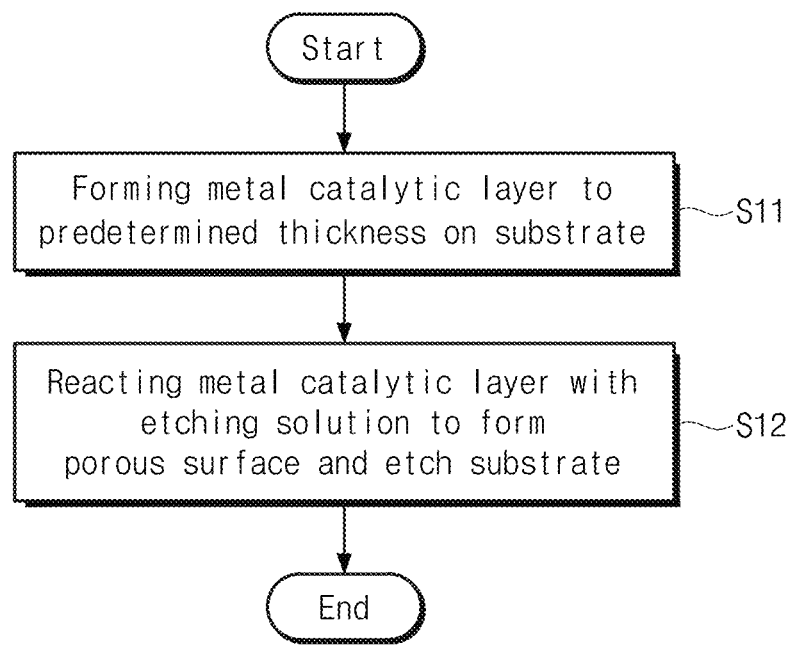
FIG. 1 is a flow chart illustrating a substrate-etching method, according to example embodiments of the inventive concept.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments of the inventive concept, a substrate-etching method may include etching a substrate using a metal-assisted chemical etching process and, for example, may include forming a metal catalytic layer, which may be formed of or include a material that can become porous when the metal catalytic layer is in contact with a predetermined etching solution, on a to-be-etched substrate to a nano-sized thickness (e.g., thickness greater than 3 nm and less than 10 nm) and reacting the metal catalytic layer with an etching solution to form a porous surface with a plurality of pin holes in the metal catalytic layer and etch the substrate.

According to example embodiments of the inventive concept, the plurality of pin holes may be formed in the porous surface of the metal catalytic layer to have a density of 1-300 ea/$\mu$m$^2$, and this may make it possible for the substrate to be etched at a high etch rate of 10-30 nm/s (in particular, of 15-30 nm/s). Furthermore, according to example embodiments of the inventive concept, since the pin holes of a desired density are formed in the metal catalytic layer, it is possible to uniformly etch a large-area substrate and to fabricate a three-dimensional semiconductor structure with a high aspect ratio.

In some embodiments, a gold-containing material may be used as an example of the metal catalytic layer, which can have a porous structure when it is in contact with an etching solution. For a gallium arsenide (GaAs) substrate, the use of the gold catalytic layer leads to experiment results that are completely different from when it is used for a silicon substrate. For example, even if the metal catalytic layer has a small thickness, it is possible to achieve remarkably improved characteristics in a substrate-etching process, compared with the case that the conventional method is used. Hereinafter, example embodiments of the inventive concept will be described in more detail with reference to the accompanying drawings.

FIG. 1 is a flow chart illustrating a substrate-etching method, according to example embodiments of the inventive concept. Referring to FIG. 1, a substrate-etching method according to example embodiments of the inventive concept may include etching a substrate using a metal-assisted chemical etching process and, for example, may include a step S11 of forming a metal catalytic layer on a to-be-etched substrate to a nano-sized thickness and a step S12 of etching the substrate using the metal catalytic layer thereon. Here, the metal catalytic layer may be formed of or include a material that can become porous, when the metal catalytic layer is in contact with a predetermined etching solution. The etching of the substrate (in the step S12) may include bringing the metal catalytic layer into contact with the etching solution to form a porous surface on the metal catalytic layer. As the porous surface is formed, the substrate may be etched along a shape of the metal catalytic layer. In certain embodiments, an additional step of removing the metal catalytic layer from the substrate may be further performed, after the step S12 of etching the substrate.

Figure 2:
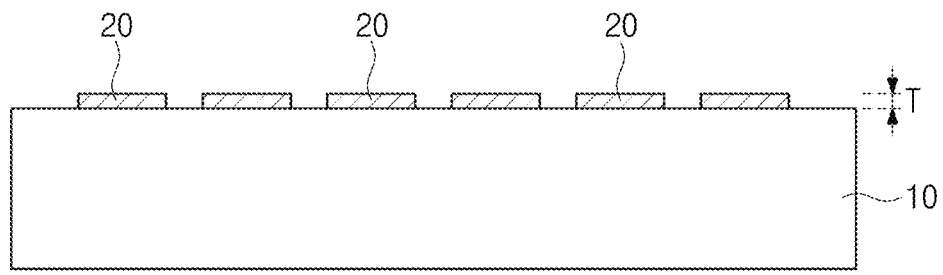
FIG. 2 is a sectional view that is provided to explain step S11 of FIG. 1.

FIG. 2 is a sectional view that is provided to explain step S11 of FIG. 1. Referring to FIGS. 1 and 2, a metal catalytic layer 20 may be formed to a predetermined thickness T on a to-be-etched substrate 10 (in S11), and here, the metal catalytic layer 20 may be formed of or include a material that can become porous, when the metal catalytic layer is in contact with a predetermined etching solution. The metal catalytic layer 20 may be patterned by, for example, a lithography process. The substrate 10 may be formed of or include a III-V semiconductor material, such as gallium arsenide (GaAs), indium phosphide (InP), or gallium nitride (GaN).

The metal catalytic layer 20 may be formed of or include precious metals (e.g., gold (Au), silver (Ag), platinum (Pt) or palladium (Pd)) or alloys thereof. The metal catalytic layer 20 may be formed on the substrate 10 by a physical vapor deposition (PVD) process, a chemical vapor deposition (CVD) process, or any other method, but example embodiments of the inventive concept may not be limited thereto.

In order to allow the pin holes in the porous surface of the metal catalytic layer 20 to have a desired density in the step S12 of FIG. 1, the step S11 may be performed in such a way that the metal catalytic layer 20 on the substrate 10 has a thickness T ranging from 3 nm to 10 nm. In the case where the thickness of the metal catalytic layer 20 is less than or equal to 3 nm, the pin holes, which are formed in the metal catalytic layer 20 during the step S12, may have an excessively high density, and this may lead to deterioration in etching characteristics for the substrate 10. By contrast, in the case where the thickness of the metal catalytic layer 20 is greater than or equal to 10 nm, the pin holes formed in the metal catalytic layer 20 may have a low density, and this may lead to a reduction in etch rate of the substrate-etching process.

To realize a more desired density of the pin holes of the metal catalytic layer 20 in the step S12, the metal catalytic layer 20 may be formed on the substrate 10 to have a thickness ranging from 4 nm to 8 nm. In certain embodiments, the metal catalytic layer 20 may be formed to have a thickness ranging from 4 nm to 6 nm. According to an experiment on compound semiconductor materials, when the metal catalytic layer 20 has a thickness of 5 nm, it is possible to etch the substrate 10 at a five-fold improved etch rate, compared with the case that the metal catalytic layer 20 has a thickness of 15 nm, and this will be described in more detail with reference to FIG. 6.

Figure 3:
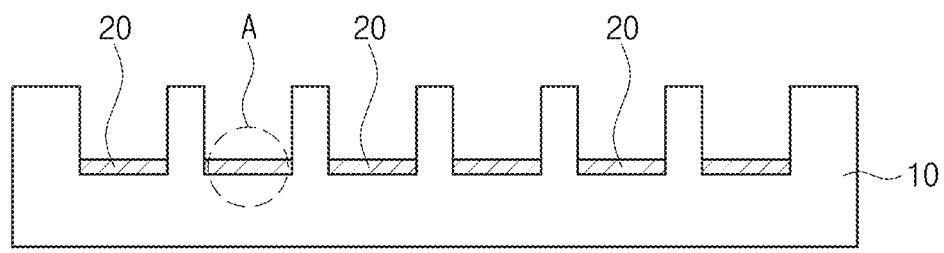
FIG. 3 is a sectional view that is provided to explain step S12 of FIG. 1.
Figure 4:
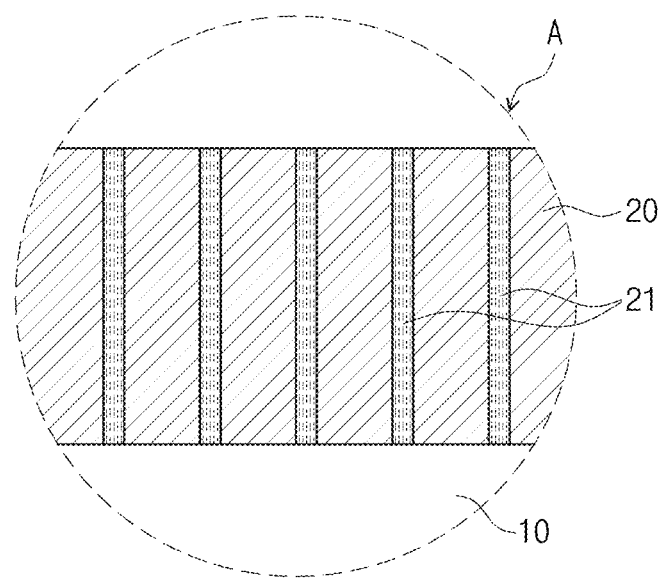
FIG. 4 is an enlarged sectional view schematically illustrating the portion A of FIG. 3.

FIG. 3 is a sectional view that is provided to explain step S12 of FIG. 1, and FIG. 4 is an enlarged sectional view schematically illustrating the portion A of FIG. 3. Referring to FIGS. 1, 3, and 4, the substrate 10 provided with the metal catalytic layer 20 may be dipped in an etching solution for a predetermined time to react the metal catalytic layer 20 with the etching solution and thereby to form a plurality of pin holes 21 in the metal catalytic layer 20 (in S12). As a result, the metal catalytic layer 20 may be formed to have a porous surface, and the substrate 10 may be etched using the metal catalytic layer 20 with the porous surface. Here, at least one of the pin holes 21 may be formed to penetrate the metal catalytic layer 20.

On a top surface of the metal catalytic layer 20, the pin holes 21 may be formed to have a density of 1-300 ea/$\mu m^2$. In the case where, on the top surface of the metal catalytic layer 20, the pin holes 21 are formed to have a low density (e.g., less than 1 ea/$\mu m^2$), a substrate-etching process may suffer from a reduction in an etch rate and deterioration in etching uniformity over the substrate 10. Also, in the case where the pin holes 21 are formed to have a high density (e.g., greater than 300 ea/$\mu m^2$), substrate-etching process may suffer from deterioration in etching characteristics for the substrate 10.

In the case where, in the step S11, the metal catalytic layer 20 is deposited to a thickness of 3 nm or less on the substrate 10, the pin holes 21 of the metal catalytic layer 20 may be formed to have a density greater than 300 ea/$\mu m^2$, and this may lead to deterioration in etching characteristics for the substrate 10. By contrast, in the case where, in the step S11, the metal catalytic layer 20 is deposited to a thickness of 10 nm or greater on the substrate 10, the pin holes 21 of the metal catalytic layer 20 may be formed to have a density less than 1 ea/$\mu m^2$, and this also may lead to deterioration in etching characteristics (e.g., an etch rate) for the substrate 10. In the case where the metal catalytic layer 20 is formed to have a thickness ranging from 3 nm to 10 nm, the pin holes 21 of the metal catalytic layer 20 may be formed to have a desired density (e.g., 1-300 ea/$\mu m^2$), and this may make it possible to etch the substrate 10 at an increased etch rate and etch a large-area substrate with good etch uniformity.

The etching solution may be chemically reacted with the metal catalytic layer 20 may be used to etch the substrate 10. The etching solution may contain, for example, sulfuric acid ($H_2SO_4$), potassium permanganate ($KMnO_4$) serving as an oxidant, and deionized water. In the etching solution, a molar concentration ratio of $H_2SO_4$ to $KMnO_4$ may range from about 200:1 to about 1000:1. When the molar concentration ratio of $H_2SO_4$ to $KMnO_4$ is less than 200:1, the etch rate may be significantly decreased. By contrast, in the case in which the molar concentration ratio of $H_2SO_4$ to $KMnO_4$ is greater than 1000:1, such a material may not be suitable for the etching solution, because brown precipitation may be produced by reaction between $H_2SO_4$ and $KMnO_4$. In certain embodiments, the etching solution may contain hydrogen fluoride (HF) and hydrogen peroxide ($H_2O_2$) serving as an oxidant.

The process of etching the substrate 10 may be performed at a process temperature of 40-60° C. or using the etching solution at a temperature of 40-60° C. In the case where the process temperature is lower than 40° C., the process of etching the substrate 10 may not be performed property. In the case where the process temperature ranges from about 40° C. to about 60° C., the etching process may be performed without no substantial change in etch rate. By contrast, in the case where the process temperature is higher than 60° C., a tiny amount of brown precipitation may be produced by reaction between $H_2SO_4$ and $KMnO_4$.

According to example embodiments of the inventive concept, a semiconductor device may include the substrate 10 and the metal catalytic layer 20, which is provided on the substrate 10 to have a thickness ranging from 3 nm to 10 nm and have a porous surface or structure provided with a plurality of the pin holes 21. On a surface of the metal catalytic layer 20, the pin holes 21 may be formed to have a density of 1-300 ea/$\mu m^2$. The semiconductor device may include a compound semiconductor three-dimensional structure, which may be used for a fin field effect transistor (FinFET), a solar cell, a light emitting diode (LED), or micro electro mechanical systems (MEMS).

Figure 5:
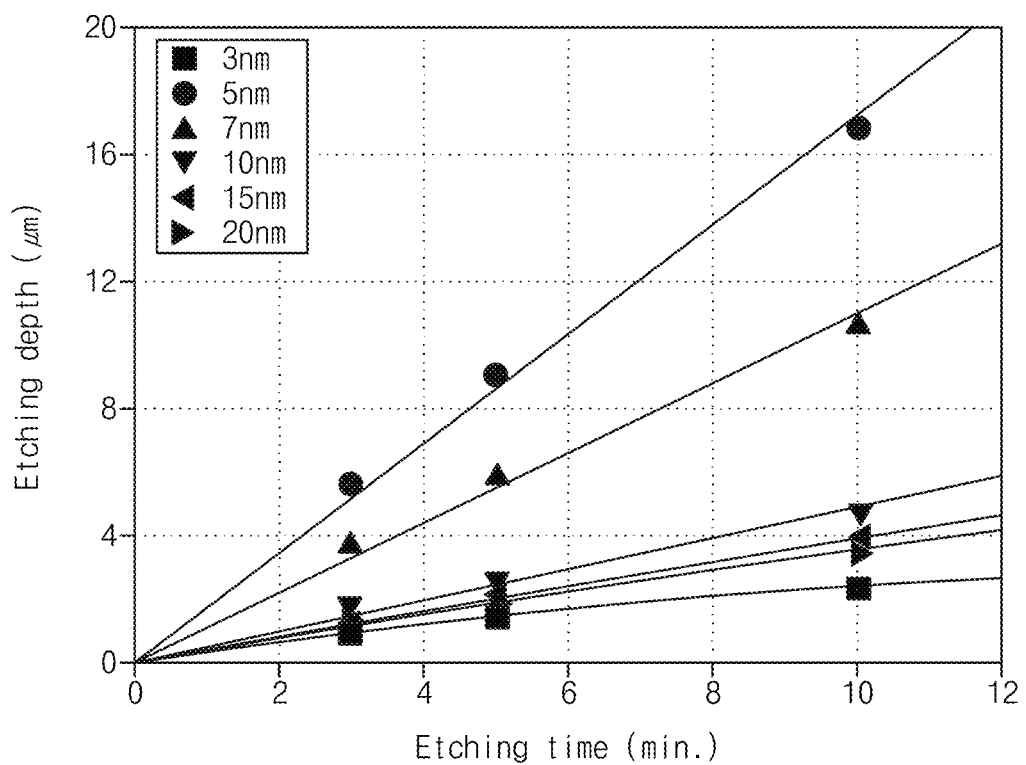
FIG. 5 is a graph showing a change in an etching depth of a substrate against an etching time, measured for various thicknesses of a metal catalytic layer.

FIG. 5 is a graph showing a change in an etching depth of a substrate against an etching time, measured for various thicknesses of a metal catalytic layer. In an example experiment, a gold (Au) catalytic layer was used as the metal catalytic layer, a GaAs substrate was used as the substrate, and 37 mM $KMnO_4$ and 1M $H_2SO_4$ were used as the etching solution. In a comparative experiment, a gold catalytic layer was deposited on a silicon substrate, and for such a silicon substrate, an etch rate was independent of a thickness of the metal catalytic layer, and moreover, when the metal catalytic layer was formed to a thickness of 12 nm, a nano wire, which may cause deterioration of a semiconductor device, was formed.

In the case of the example experiment using the compound semiconductor (i.e., GaAs) substrate, any nanowire was not grown from the porous surface of the metal catalytic layer, and when a thickness of the metal catalytic layer was small, an etch rate had a strong dependence on the thickness of the metal catalytic layer. For example, as shown in FIG. 5, metal catalytic layers were formed to thicknesses of 5 nm, 7 nm, 10 nm, 15 nm, and 20 nm, respectively, and in this case, change rates in etching depth of the substrate (i.e., etch rates) showed a tendency to rapidly increase, when the metal catalytic layers had thicknesses less than 10 nm.

Figure 6:
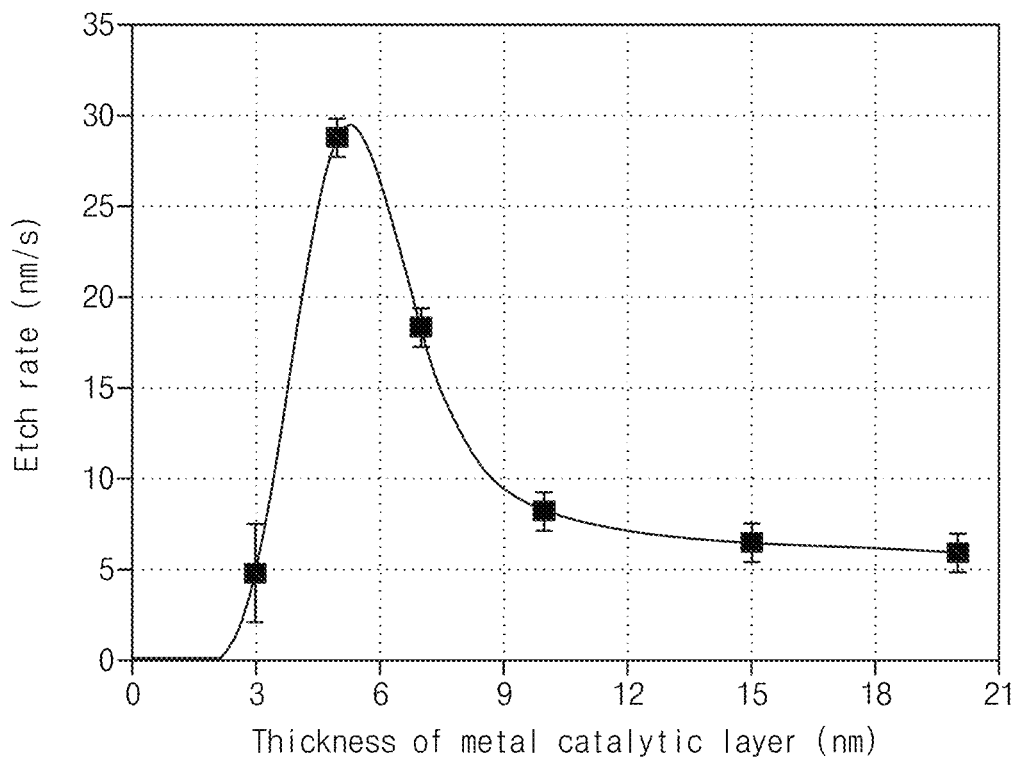
FIG. 6 is a graph showing a substrate etch rate against a thickness of a metal catalytic layer.

FIG. 6 is a graph showing a substrate etch rate against a thickness of a metal catalytic layer. The curve of FIG. 6 was obtained by calculating a change rate in etching depth of a substrate per a given etching time, for the metal catalytic layers with several thicknesses, shown in FIG. 5. Referring to FIG. 6, when the metal catalytic layer had a thickness of 3 nm, the substrate was etched at a very slow etch rate of about 5 nm/s, and when the metal catalytic layer had a thickness of 10 nm or greater, the substrate was also etched at a slow etch rate of about 6-8 nm/s. By contrast, when the metal catalytic layer had a thickness ranging from 3 nm to 10 nm, the substrate was etched at a fast etch rate of about 18-30 nm/s.

Figure 7:
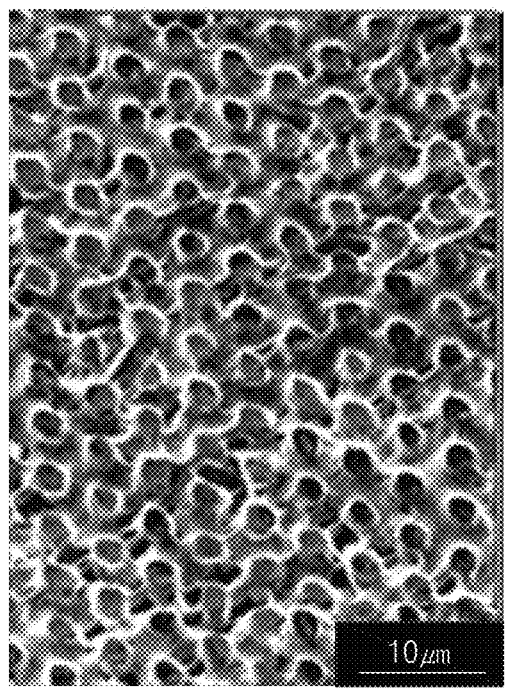
FIG. 7 is a low magnification scanning electron microscope (SEM) image of a metal catalytic layer, which was deposited to a thickness of 3 nm on a substrate and then was used to etch the substrate.
Figure 8:
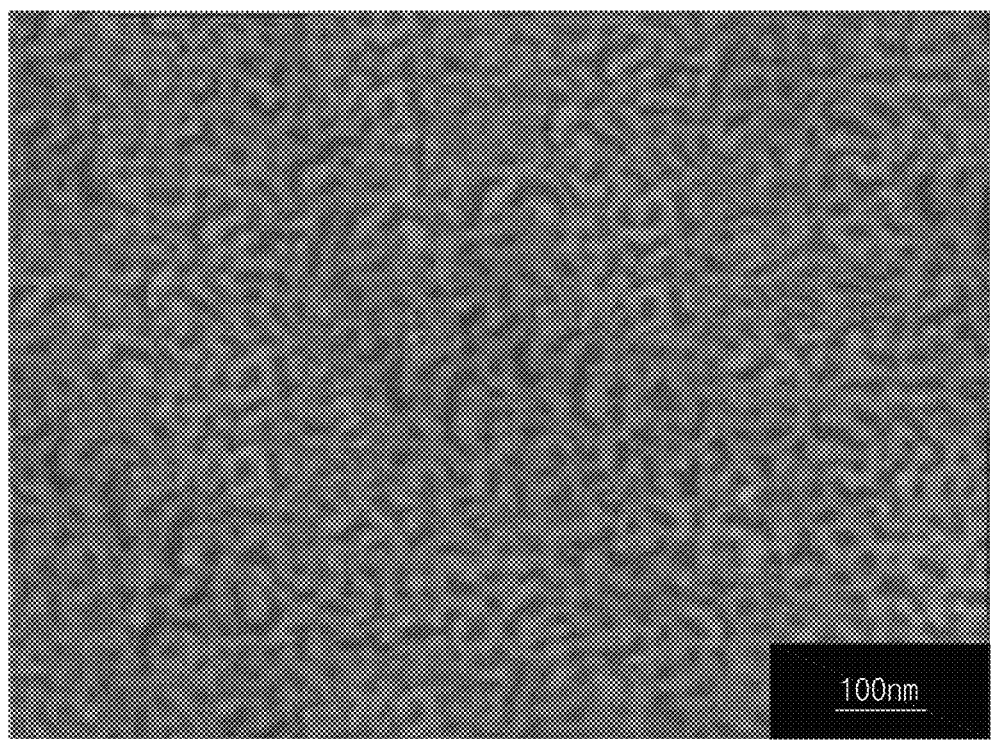
FIG. 8 is a high magnification SEM image of a metal catalytic layer, which was deposited to a thickness of 3 nm on a substrate and then was used to etch the substrate.

After the etching process, the metal catalytic layers were inspected using a scanning electron microscope (SEM) system, so as to know why, when the metal catalytic layer had a thickness greater than 3 nm and less than 10 nm, the substrate was etched at a high etch rate, as shown in FIG. 6. FIGS. 7 and 8 are low and high magnification scanning electron microscope (SEM) images of a metal catalytic layer, which was deposited to a thickness of 3 nm on a substrate and then was used to etch the substrate.

In this example experiment, a gold (Au) catalytic layer was used as the metal catalytic layer, a GaAs substrate was used as the substrate, 37 mM $KMnO_4$ and 1M $H_2SO_4$ were used as the etching solution, and the etching process was performed for 10 minutes. Referring to FIGS. 7 and 8, when the metal catalytic layer had a thickness of 3 nm or less, so many pin holes were formed on a surface of the metal catalytic layer. For example, when the metal catalytic layer had a thickness of 3 nm, the pin holes were formed to have a density greater than 300 ea/$\mu m^2$, and this led to a reduction in etch rate of the substrate.

Figure 9:
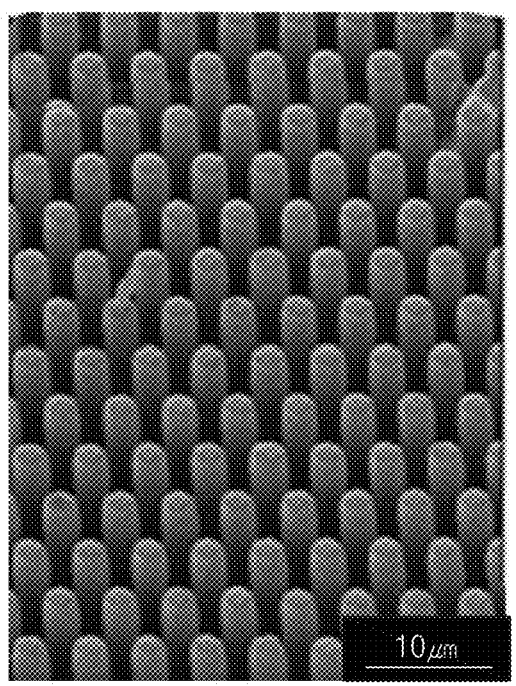
FIG. 9 is a low magnification SEM image of a metal catalytic layer, which was deposited to a thickness of 5 nm on a substrate and then was used to etch the substrate.
Figure 10:
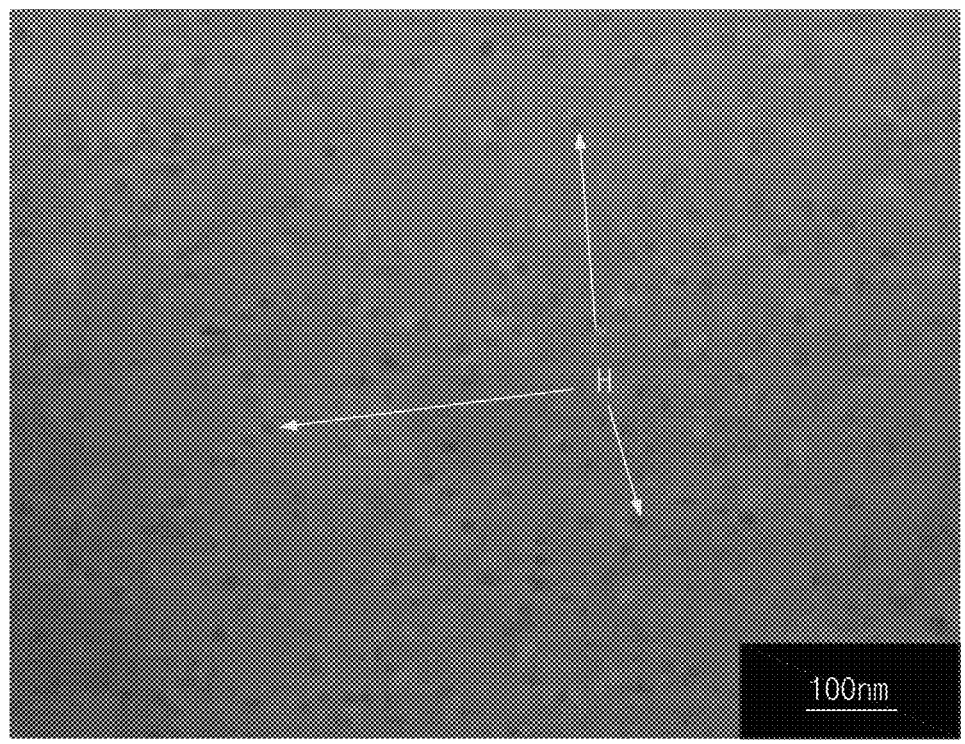
FIG. 10 is a high magnification SEM image of a metal catalytic layer, which was deposited to a thickness of 5 nm on a substrate and then was used to etch the substrate.
Figure 11:
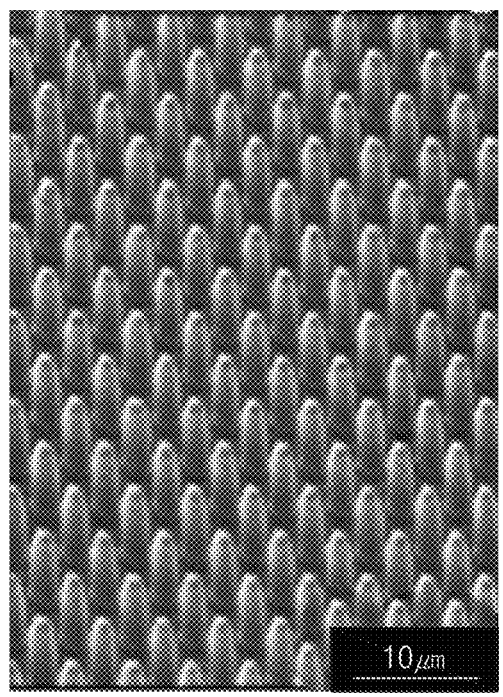
FIG. 11 is a low magnification SEM image of a metal catalytic layer, which was deposited to a thickness of 7 nm on a substrate and then was used to etch the substrate.
Figure 12:
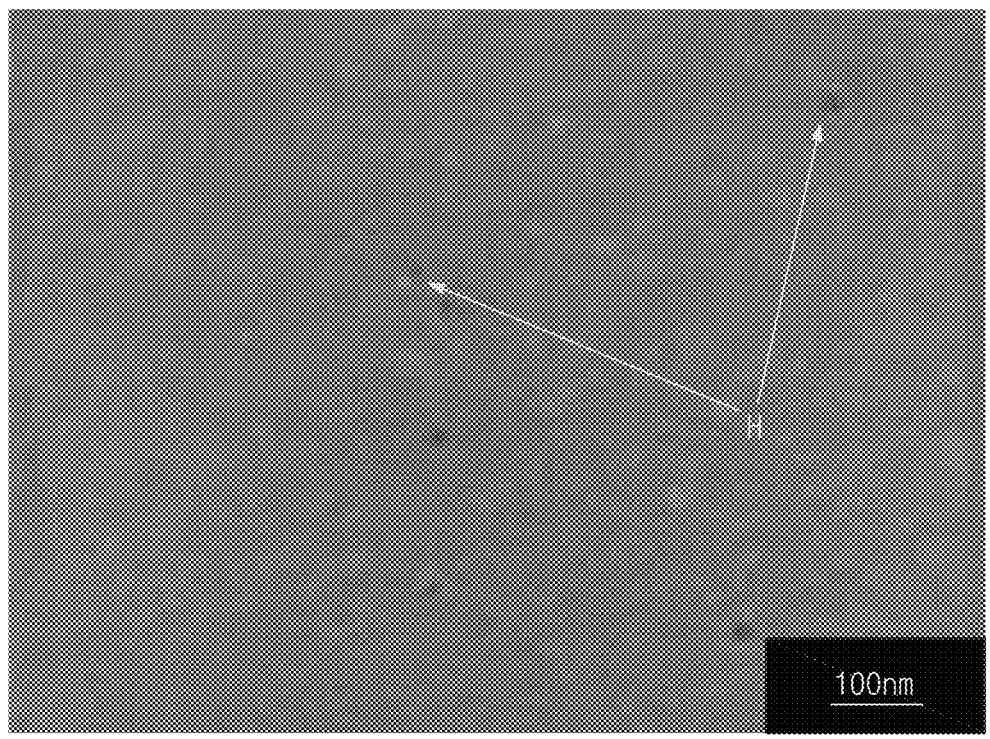
FIG. 12 is a high magnification SEM image of a metal catalytic layer, which was deposited to a thickness of 7 nm on a substrate and then was used to etch the substrate.

FIGS. 9 and 10 are low and high magnification SEM images of a metal catalytic layer, which was deposited to a thickness of 5 nm on a substrate and then was used to etch the substrate, and FIGS. 11 and 12 are low and high magnification SEM images of a metal catalytic layer, which was deposited to a thickness of 7 nm on a substrate and then was used to etch the substrate.

Similar to the example of FIGS. 7 and 8, in this example experiment, a gold (Au) catalytic layer was used as the metal catalytic layer, a GaAs substrate was used as the substrate, 37 mM $KMnO_4$ and 1M $H_2SO_4$ were used as the etching solution, and the etching process was performed for 10 minutes. Referring to FIGS. 9 through 12, when the metal catalytic layer had a thickness ranging from 3 nm to 10 nm, the pin holes H were formed to have a desired density, and thus, it was possible to etch the substrate with improved etching characteristics (e.g., etch rate, etch uniformity, or the like).

Figure 13:
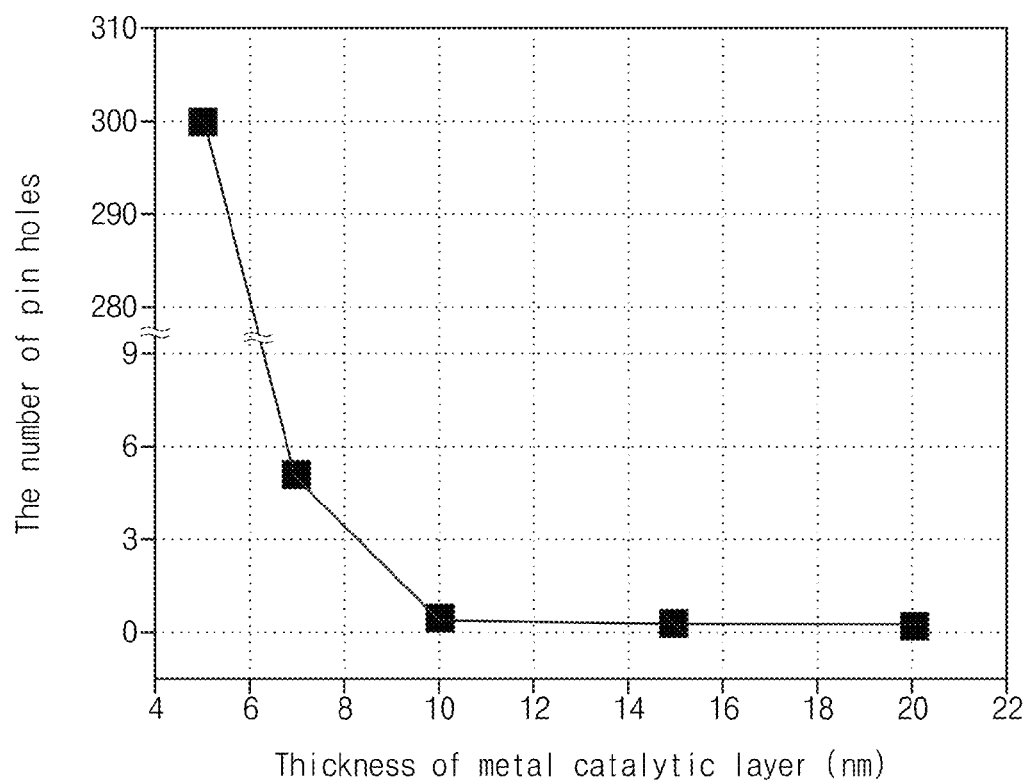
FIG. 13 is a graph showing a density of pin holes, which were formed in a surface of a metal catalytic layer after etching a substrate using the metal catalytic layer, against a thickness of the metal catalytic layer.

FIG. 13 is a graph showing a density of pin holes, which were formed in a surface of a metal catalytic layer after etching a substrate using the metal catalytic layer, against a thickness of the metal catalytic layer. FIG. 13 shows densities of pin holes in metal catalytic layers, each of which was prepared to have an area of 1196 nm×897 nm. In this example experiment, a gold (Au) catalytic layer was used as the metal catalytic layer, a GaAs substrate was used as the substrate, 37 mM $KMnO_4$ and 1M $H_2SO_4$ were used as the etching solution, and the etching process was performed for 10 minutes.

Referring to FIG. 13, a density of pin holes, which were formed in a surface of a metal catalytic layer, was changed depending on a thickness of the metal catalytic layer. If the density of the pin holes is increased, the etching solution can be supplied to the substrate through more infiltration paths, and thus, the substrate can be etched at an increased etch rate. However, if the pin holes are excessively formed in the metal catalytic layer, it may be difficult to maintain a shape of a layer, and thus, the substrate may be etched at a reduced etch rate.

In the case where the metal catalytic layer is formed on the substrate to have a thickness of 3 nm or less, the pin holes formed in the metal catalytic layer may have a density greater than 300 ea/$\mu m^2$, and the process of etching the substrate may suffer from deteriorated etching characteristics. Accordingly, to limit the density of the pin holes, it is necessary for the metal catalytic layer on the substrate to have a thickness greater than 3 nm. Contrary to this, in the case where the metal catalytic layer is formed on the substrate to have a thickness of 10 nm or greater, the pin holes may not be formed in the metal catalytic layer after the etching of the substrate, and thus, by forming the metal catalytic layer having a thickness of 10 nm or greater, it is possible to uniformly control an etch rate of the substrate. In sum, in the case in which the metal catalytic layer is formed on the substrate to have a thickness greater than 3 nm and less than 10 nm, during the etching process of the substrate, it is possible for the pin holes in the metal catalytic layer to have a desired density (e.g., 1-300 ea/$\mu m^2$), and this may make it possible to etch the substrate at an increased etch rate and moreover to etch a large-area substrate with good etch uniformity.

According to example embodiments of the inventive concept, by controlling a thickness of a metal catalytic layer without a change in any other process condition, it is possible to change an etch rate of a substrate. When the metal catalytic layer having a thickness less than 10 nm is formed on the substrate, the substrate may be etched at a high etch rate, and such an etch rate may be changed sensitively depending on the thickness of the metal catalytic layer. For example, it is possible to achieve a high etch rate, by depositing a metal catalytic layer having a thickness less than 10 nm, and in particular, the highest etch rate may be obtained when the metal catalytic layer is formed to have a thickness of 5 nm. By contrast, when the metal catalytic layer is formed to have a thickness greater than 10 nm, the etch rate may be decreased, and the etch rate of the substrate may not have dependency on the thickness of the metal catalytic layer. According to example embodiments of the inventive concept, by controlling a thickness of a metal catalytic layer, it is possible to increase an etch rate of the substrate four to five times, compared to that of the conventional method.

Figure 14:
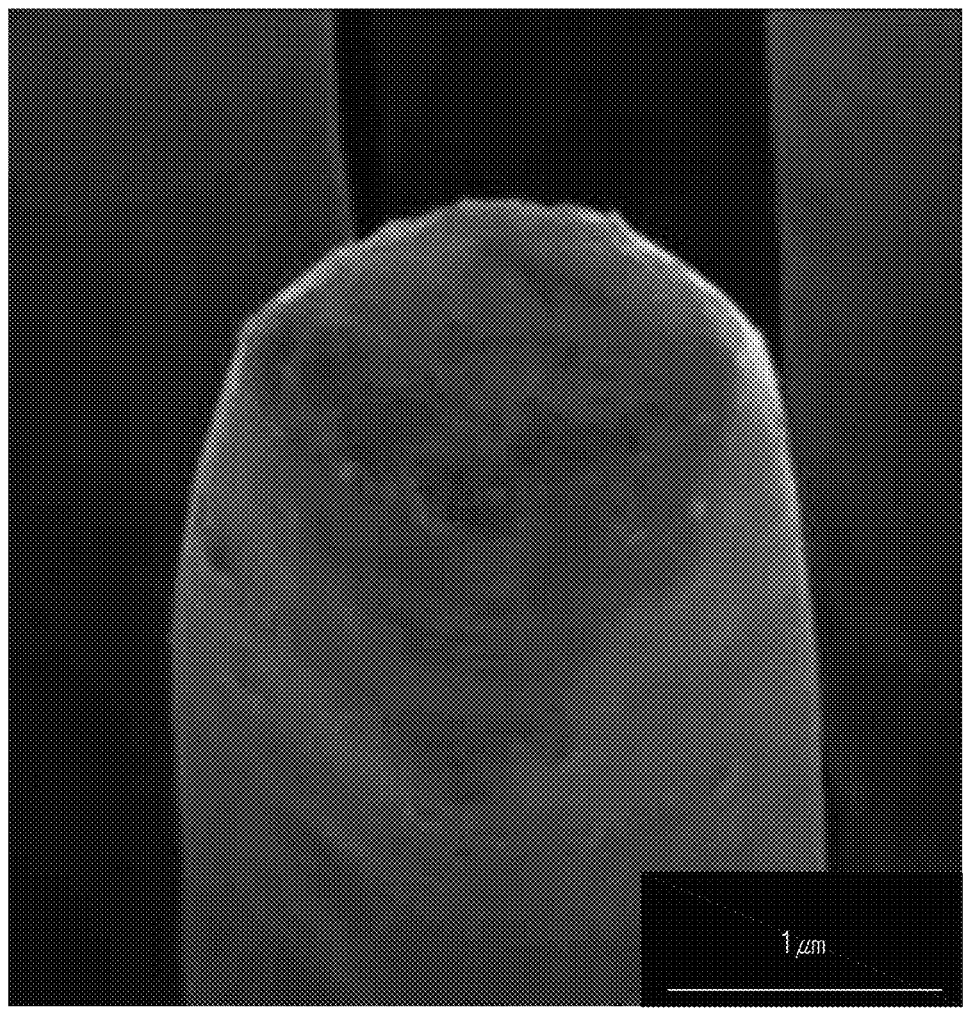
FIG. 14 is a SEM image of a pillar formed by etching a substrate using a metal catalytic layer having a thickness of 5 nm.
Figure 15:
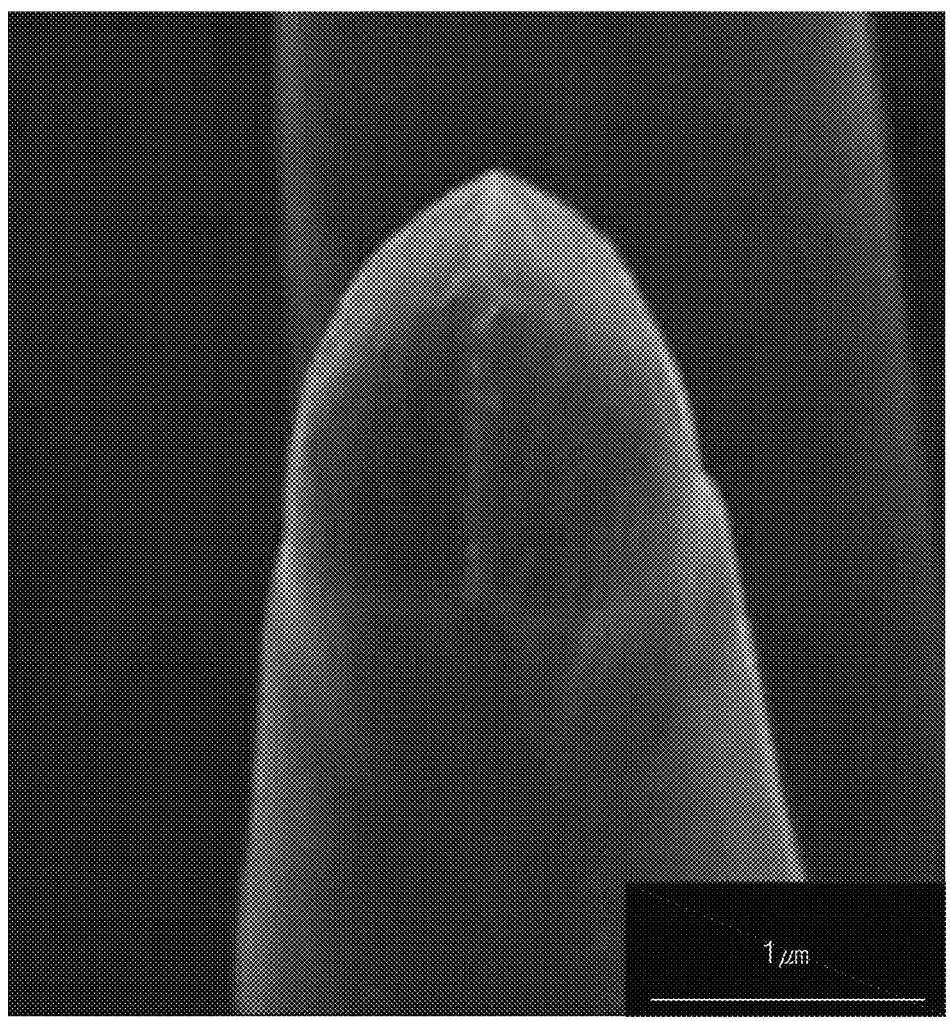
FIG. 15 is a SEM image of a pillar formed by etching a substrate using a metal catalytic layer having a thickness of 7 nm.

FIGS. 14 and 15 are SEM images of pillars, which were formed by etching a substrate using metal catalytic layers having thicknesses of 5 nm and 7 nm, respectively. Referring to FIGS. 14 and 15, an upper shape of a pillar formed after the etching process of the substrate had dependency on the thickness of the metal catalytic layer.

The conventional metal-assisted chemical etching process is based on a mechanism of in-plane mass transport. For example, in an initial stage of the conventional metal-assisted chemical etching process, both end portions of the metal catalytic layer are etched, and the etch rate may be low and the substrate may be etched in a conical and isotropic manner. By contrast, according to example embodiments of the inventive concept, the substrate-etching process is based on a mechanism of out-of-plane mass transport. For example, in the etching process according to example embodiments of the inventive concept, a thin metal catalytic layer may be used to form the pin holes, and thus, the etching process may be rapidly performed through a mass transport process and can realize an anisotropic and cylindrical profile.

As an example, when the metal catalytic layer has a thickness of 5 nm, an etching mechanism is performed based on a mechanism of out-of-plane mass transport, and it is possible to prevent a lateral etching, which may occur in an initial stage of the conventional etching process, and thereby to form cylindrical pillars on the substrate, as shown in FIG. 14. As the thickness of the metal catalytic layer increases, the density of the pin holes may be reduced and the etching process may be more strongly dependent on the in-plane mass transport behavior. Accordingly, in the case where the metal catalytic layer has a thickness of 7 nm, the pin holes may be formed in the metal catalytic layer to have a reduced density and the pillars on the substrate may be formed to have a conical shape, as shown in FIG. 15.

Figure 16:
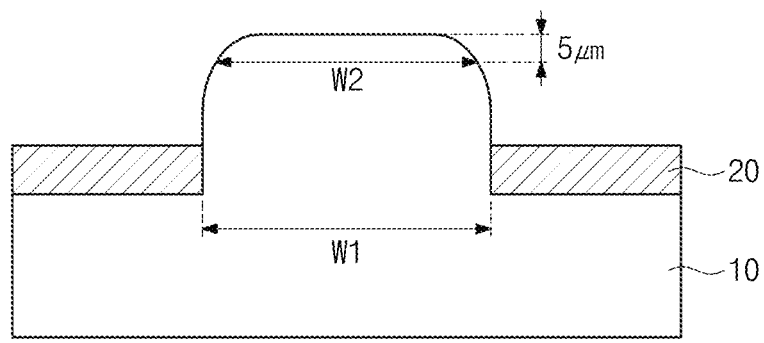
FIG. 16 is a sectional view schematically illustrating a semiconductor device fabricated by a substrate-etching method, according to example embodiments of the inventive concept.
Figure 17:
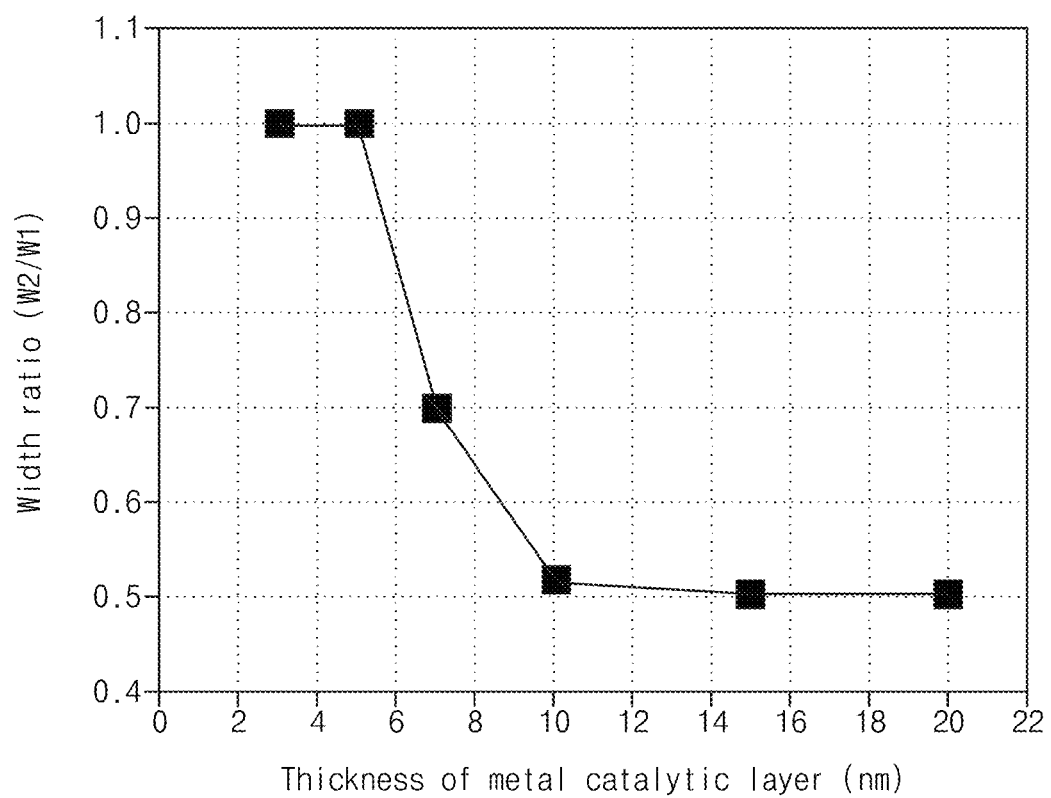
FIG. 17 is a graph showing a ratio between upper and lower widths of a pillar, which was formed on a substrate by the etching method, against a thickness of the metal catalytic layer.

FIG. 16 is a sectional view schematically illustrating a semiconductor device fabricated by a substrate-etching method, according to example embodiments of the inventive concept, and FIG. 17 is a graph showing a ratio between upper and lower widths of a pillar, which was formed on a substrate by the etching method, against a thickness of the metal catalytic layer. Here, the upper width W2 of the pillar was measured at a level lower by 5 μm from the top of the pillar, and the lower width W1 was measured at a bottom level of the pillar. Referring to FIGS. 16 and 17, when the metal catalytic layer had a thickness ranging from 3 nm to 10 nm, the ratio of W2 to W1 had a relatively high value (e.g., of 0.7-1.0). That is, according to example embodiments of the inventive concept, it is possible to form a three-dimensional semiconductor structure with high squareness.

As described above, according to example embodiments of the inventive concept, in a process of etching a compound semiconductor substrate, by controlling a thickness of a metal catalytic layer to a specific range, pin holes in the metal catalytic layer can be formed to have a desired density, and moreover, it possible to uniformly and quickly etch a large-area substrate and to fabricate a three-dimensional semiconductor structure with a high aspect ratio.

According to example embodiments of the inventive concept, it is possible to increase an etch rate of a substrate, and in particular, to improve etching characteristics in a process of etching a compound semiconductor substrate (e.g., made of GaAs).

Furthermore, a metal catalytic layer may be formed to have a porous surface provided with pin holes of a desired density, and this makes it possible to uniformly etch a large-area substrate and to fabricate a three-dimensional semiconductor structure with a high aspect ratio.

While example embodiments of the inventive concepts have been particularly shown and described, it will be understood by one of ordinary skill in the art that variations in form and detail may be made therein without departing from the spirit and scope of the attached claims.

What is claimed is:

1. A method of etching a substrate using a metal-assisted chemical etching process, the method comprising:
   forming a metal catalytic layer to have a thickness greater than 3 nm and less than 10 nm on a substrate; and
   reacting the metal catalytic layer with the etching solution to form a porous surface in the metal catalytic layer and etch the substrate,
   wherein a plurality of pin holes of the porous surface are formed in the metal catalytic layer, the plurality of pin holes being formed by the reaction with the etching solution, and
   wherein the pin holes are formed in the metal catalytic layer to have a density of 1-300 ea/$\mu$m2.

2. The method of claim 1, wherein the metal catalytic layer comprises at least one metal catalytic material selected from Au, Ag, Pt, and Pd.

3. The method of claim 1, wherein the metal catalytic layer on the substrate is formed to have a thickness ranging from 4 nm to 6 nm.

4. The method of claim 1, wherein the etching solution contains at least one selected from $H_2SO_4$ and HF and at least one selected from $KMnO_4$ and $H_2O_2$.

5. The method of claim 4, wherein the etching solution contains $H_2SO_4$ and $KMnO_4$, and a molar concentration ratio of $H_2SO_4$ to $KMnO_4$ ranges from 200:1 to 1000:1.

6. The method of claim 5, wherein a temperature of the etching solution ranges from 40° C. to 60° C.

7. A semiconductor device, comprising:
   a substrate; and
   a metal catalytic layer on the substrate, the metal catalytic layer being provided to have a thickness greater than 3 nm and less than 10 nm, the metal catalytic layer having a porous surface,
   wherein a plurality of pin holes of the porous surface are formed in the metal catalytic layer, the plurality of pin holes being formed by the reaction with the etching solution to have a density of 1-300 ea/$\mu$m2.

8. The device of claim 7, wherein the substrate is a compound semiconductor substrate comprising at least one selected from gallium arsenide (GaAs), indium phosphide (InP), and gallium nitride (GaN).

9. The device of claim 7, wherein the metal catalytic layer comprises at least one metal catalytic material selected from Au, Ag, Pt, and Pd.

* * * * *